United States Patent
Abbink et al.

(10) Patent No.: US 7,292,031 B2
(45) Date of Patent: Nov. 6, 2007

(54) MICRO-CELL FOR NMR GYROSCOPE

(75) Inventors: Henry C. Abbink, Westlake Village, CA (US); Edward Kanegsberg, Pacific Palisades, CA (US); Kenneth D. Marino, Oak Park, CA (US); Charles H. Volk, Newbury Park, CA (US)

(73) Assignee: Northrop Grumman Corporatin, Los Angeles, CA (US)

( * ) Notice: Subject to any disclaimer, the term of this patent is extended or adjusted under 35 U.S.C. 154(b) by 105 days.

(21) Appl. No.: 11/312,310

(22) Filed: Dec. 20, 2005

(65) Prior Publication Data

US 2006/0132130 A1    Jun. 22, 2006

(51) Int. Cl.
*G01V 3/00* (2006.01)
(52) U.S. Cl. .................... 324/304; 324/305
(58) Field of Classification Search ............... 324/304, 324/305

See application file for complete search history.

(56) References Cited

U.S. PATENT DOCUMENTS

| | | | |
|---|---|---|---|
| 3,577,069 A | 5/1971 | Malnar et al. | |
| 4,450,407 A | 5/1984 | Kwon et al. | |
| 4,461,996 A * | 7/1984 | Kwon | 324/315 |
| 4,596,962 A | 6/1986 | Robinson | |
| 6,261,320 B1 * | 7/2001 | Tam et al. | 623/1.15 |

* cited by examiner

*Primary Examiner*—Louis M. Arana
(74) *Attorney, Agent, or Firm*—Carmen B. Patti & Assoc., LLC

(57) ABSTRACT

A cell in one example comprises an alkali metal and a coating of parylene on an interior surface of the cell. In one implementation, the alkali metal may be an optically pumped gaseous phase of an alkali metal. The parylene coating minimizes interaction of the excited state of the alkali metal, increases lifetime of the excited state, and minimizes interaction of nuclear spin states with the cell walls.

40 Claims, 4 Drawing Sheets ved in sealing of the cell. The interior of the cell is then coated with parylene.

MICRO-CELL FOR NMR GYROSCOPE

BACKGROUND

This application relates generally to nuclear magnetic resonance (NMR) gyroscopes and atomic clocks, and in particular to fabrication, coating, and sealing of alkali vapor cells suitable for both applications.

Atomic clocks and NMR gyroscopes (gyros) utilize generally glass cells containing alkali metal, alkali metal vapor and various other gases. The alkali metal is optically pumped to an excited state. For the optimum operation of either the clock or gyro, interaction of the alkali vapor with the walls must be minimized. One way is to use a buffer gas to reduce the number of collisions with the walls. The other way is to minimize the interaction with the walls when a collision does occur. Various coatings have been utilized to minimize interaction. For atomic clocks, paraffin has been used. For NMR gyros, certain hydrides have been used.

Thus, a need exists for a cell having a high transmissivity at wavelengths of interest while minimizing undesired cell wall interactions.

SUMMARY

The invention in one implementation encompasses a cell. The cell comprises an alkali metal and a coating of parylene on an interior surface of the cell.

Another implementation of the invention encompasses a method. The method comprises the steps of forming a cell from an optically transmissive material having an opening therethrough, attaching top and bottom covers to the optically transmissive material, forming an opening in one of the top or bottom covers to provide a fill hole for the cell, depositing a coating of parylene on an interior surface of the cell, and placing an alkali metal within the cell.

DESCRIPTION OF THE DRAWINGS

Features of exemplary implementations of the invention will become apparent from the description, the claims, and the accompanying drawings in which:

DETAILED DESCRIPTION

Figure 1:
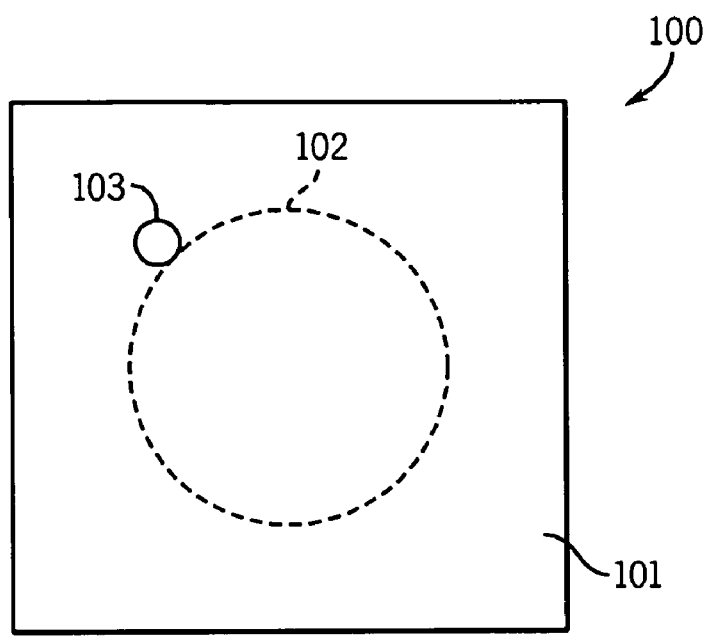
FIG. 1 is a top plan view of a cell of the prior art.
Figure 2:
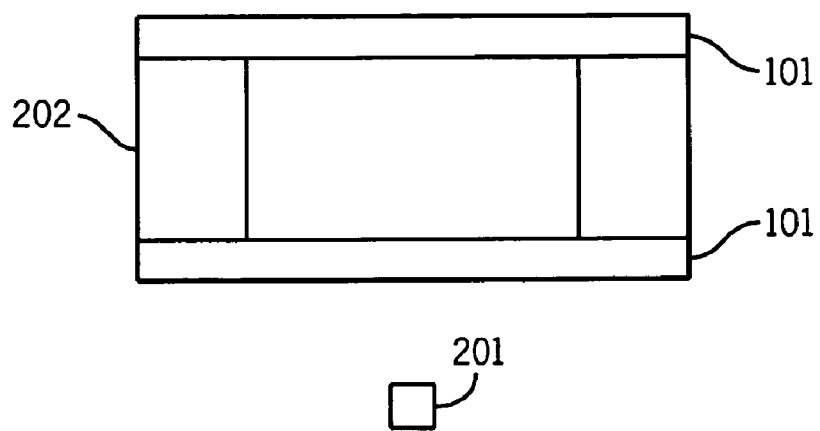
FIG. 2 is a side elevational view of the cell of FIG. 1.
Figure 3:
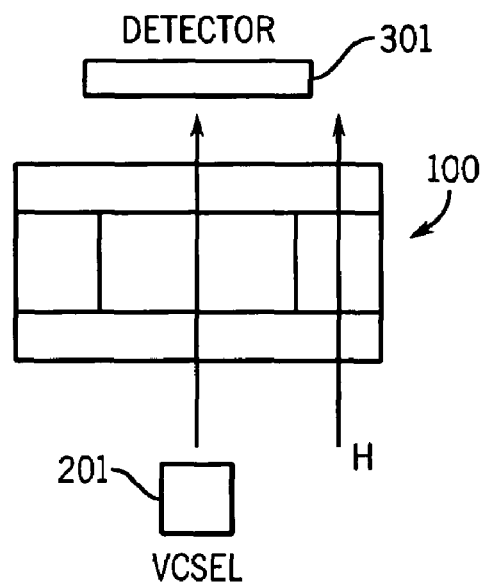
FIG. 3 depicts a cell arrangement suitable for an atomic clock implementation.
Figure 4:
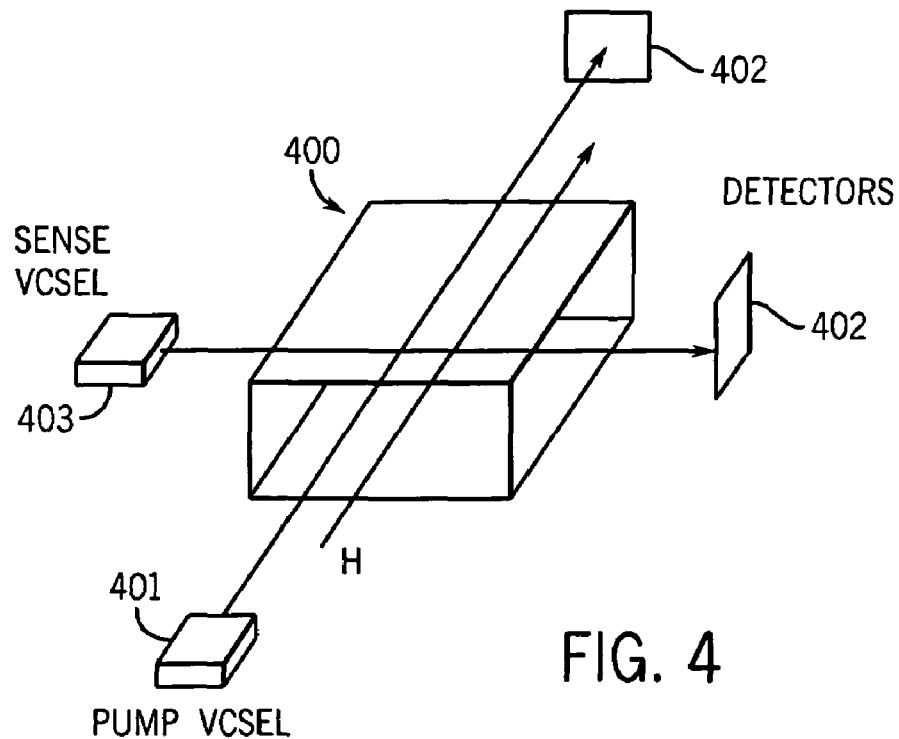
FIG. 4 illustrates a cell configuration for an NMR gyro.

Cells made using MEMS (micro-electromechanical systems) technology have been developed for chip-scale atomic clocks. FIGS. 1 and 2 illustrate the basic principle. The cell 100 uses a standard pyrex-silicon-pyrex wafer sandwich, in which relatively transparent pyrex wafers 101 are bonded to an open silicon structure 202 to form a cell. Generally, the wafers 101 are bonded to the silicon 202 by anodic bonding. A mirrored surface 102 may or may not be included. Naturally, the mirrored surface 102 would be included in a double-pass arrangement where the detector would be on the same side of the cell as the light source 201. FIG. 3 depicts a cell arrangement suitable for an atomic clock, in which the detector 301 is oppositely disposed from the light source 201. In FIGS. 1-3, the light source 201 is a VCSEL (Vertical Channel Surface Emitting Laser). Much better performance can be obtained for a gyro implementation by utilizing the arrangement shown in FIG. 4, which exhibits light transparency (high transmissivity) in the near infrared (IR) on two orthogonal axes.

Both atomic clocks and NMR gyros use optically pumped alkali atoms. In a clock, the hyperfine splitting of the ground state gives the time-stable frequency required in a precise clock. In a gyro, the spin moment of the Zeeman levels are transferred via collision to the nuclei of noble gas atoms. The subsequent precession of these moments about an applied magnetic field is observed by their effect on the alkali atoms and detected as modulation of a light beam. By comparing the precession frequencies of two noble gas systems, desired rotation effects can be extracted. The basic operation of a gyro system is described in detail in U.S. Pat. No. 4,157,495, the disclosure of which is fully incorporated by reference thereto as though fully set forth herein.

Since both atomic clocks and NMR gyros employ alkali metals optically pumped from their ground state, a competitive advantage could be obtained by designing an instrument that contains both clock and gyro functionality. It would require adding a number of features to the clock, including the need for a transverse interrogation beam to obtain gyro precession signals, more uniform and directed magnetic field, and perhaps separate light sources for gyro signals. Virtually all small inertial navigation systems currently envisioned need both gyro and clock functions. However, although each individual instrument would be more complicated, the sum would be both smaller and less costly than having dedicated instruments for each function.

Figure 5:
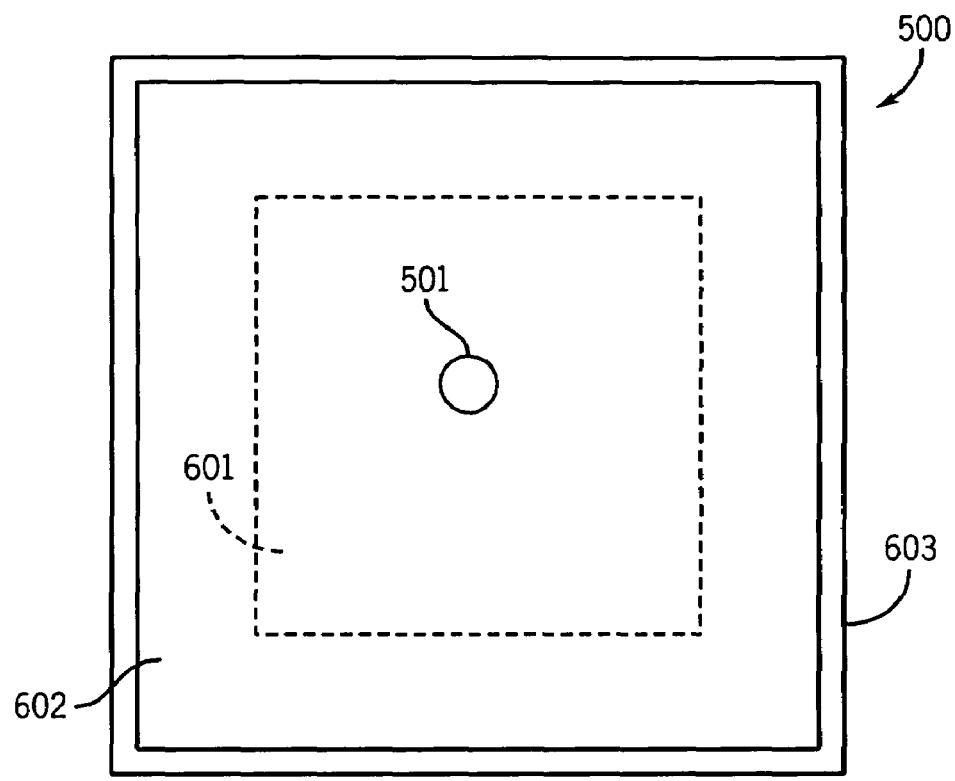
FIG. 5 is a top plan view of a cell in accordance with one embodiment of the present invention.
Figure 6:
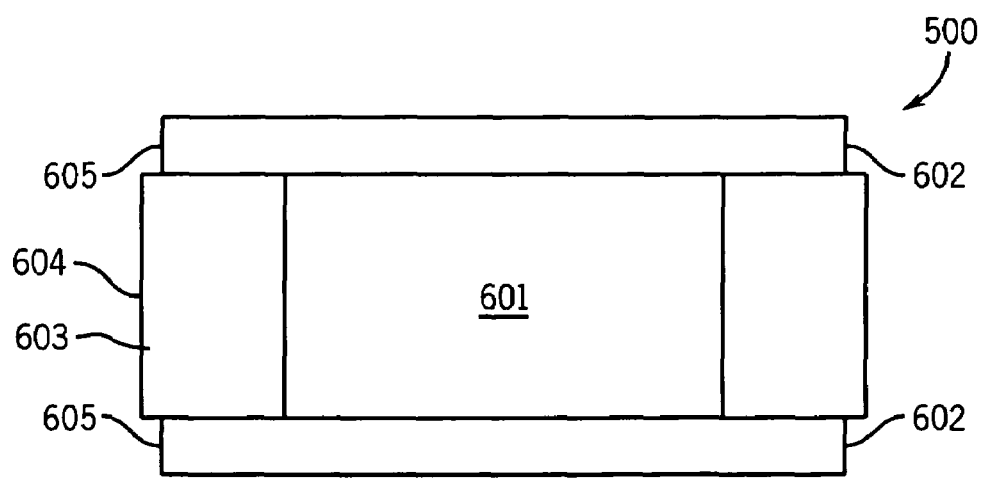
FIG. 6 is a side elevational view of the cell of FIG. 5.

FIGS. 5 and 6 illustrate the design and fabrication processes and sequence for NMR gyro cells. The cells 500 are filled at the wafer level, and then sealed at the wafer level under an atmosphere of the required gases (like Xe and Kr or selected isotopes thereof). First, a cell opening 601 is cut into the pyrex wafer 603. Top and bottom silicon covers 602 are anodically bonded to the pyrex wafer 603, one at a time, with one of the top or bottom covers 602 having a fill hole 501 provided therein. The interior of the cell 601 is then coated with parylene.

Parylene is an extremely inert polymer film. It is deposited in vacuum and is completely conformal. It has a wide working temperature range from −200 to +200 deg C. The films can be optically transparent as required for either atomic clock or NMR gyro applications. It performs as a coating like paraffin, but is much more uniformly deposited and has a much larger working temperature range. The monomer deposits as a film inside the cell with only a small fill hole (501 in FIG. 5). Cells are then sealed by melting a film of parylene over the fill hole.

It is anticipated that parylene will manifest spin lifetime enhancing properties similar to paraffin. It is known that an NMR gyro utilizes two kinds of spins. One is the spin of orbital electrons of the alkali metal. This state is obtained by optical pumping. Both clock and gyro use this state. This state normally has a lifetime of the order of a millisecond. Paraffin has been shown to increase this lifetime substantially, perhaps up to one second. Since parylene is also a hydrocarbon, it should be similarly effective, and certainly performs better than bare glass cell walls.

The other kind of spin is the nuclear spin. Xe129 and Xe131, both of which occur in natural Xenon, can be caused to have preferred spin direction by the interaction with optically pumped alkali. With large cells and certain coatings, Xenon spin can have a lifetime well over 100 seconds. While paraffin may not have been studied extensively with respect to nuclear spin lifetime, there is reason to believe that both paraffin and parylene may be effective for nuclear spins as well. While nuclear spin lifetime is of primary importance, an improvement in the electron (or atomic) spins would be beneficial in both gyro and clock applications.

Filling and sealing is done in a controlled atmosphere, such as in a glove box. The inside of the glove box is heated to a temperature above the melting point of the alkali metal. Rubidium, for example, has a melting temperature of about 38.5 degrees C. An aliquot of liquid metal is then pipetted into each cell via the fill hole. Of course, to ensure that the liquid metal pipettes properly, the cell, the pipette, and the source of alkali metal should all be maintained at or above the alkali metal's melting temperature. The atmosphere in the glove box contains other gaseous components as required for the operation of the gyro or clock. Then a film of parylene on a stretch frame is placed over the array of cells in the wafer and brought into contact with the cells. A circular melt zone is then created around the fill hole. This could be automated with a step and repeat table in the glove box. To create the circular melt zone, a tiny shaped, temperature-controlled "iron" could be used, or a controlled power laser, such as a $CO_2$ laser could be programmed to scan a circular path to melt the parylene.

Obviously, the sequence could be modified to dice before filling and sealing and do filling and sealing at the chip level if precautions are taken not to contaminate the cells during dicing. The parylene can be removed from the top and bottom of the wafer by plasma etch.

It may be worth noting that the fill hole 501 may be located other than the center of the chip and the relative height and width of the cell may be various to optimize NMR gyro performance. Further, the interior of the cell may not be square, but could be round or any other shape that would optimize NMR gyro performance.

Figure 7:
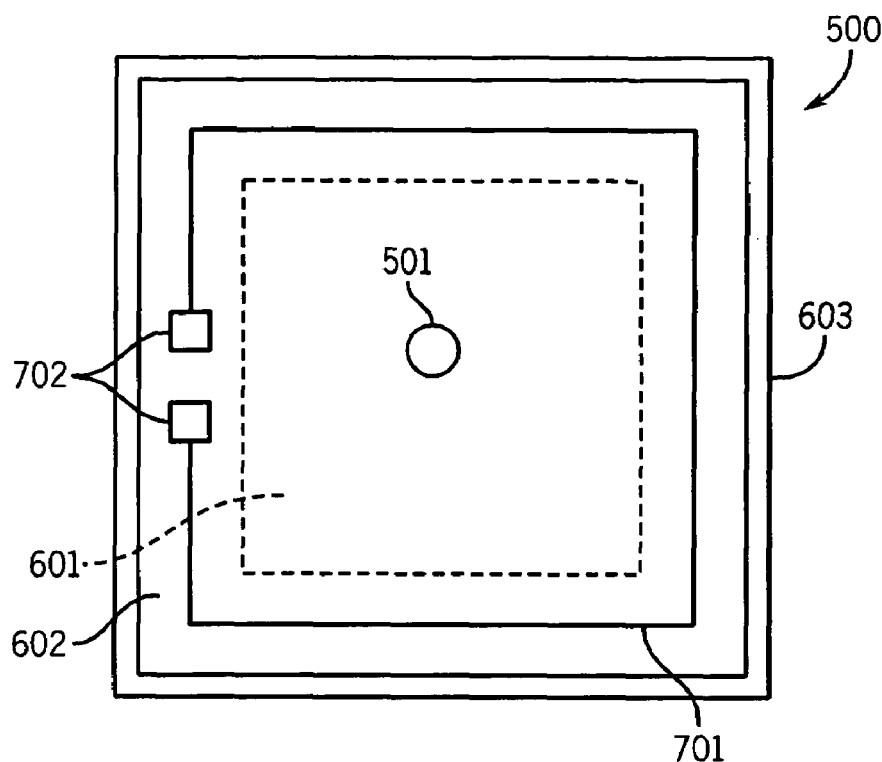
FIG. 7 is a top plan view of a cell illustrating heater placement.

Since it is necessary to control the temperature of the cell 500 very roughly at 100 degrees C., a heater (701, in FIG. 7) may be added to the cell 500. This can be done by standard lithography and deposition (e-beam, sputtering) methods. In the gyro assembly, the cell will be suspended in a vacuum to minimize gyro power. By judicious placement of the heaters 701, a gradient can be established within the cell 500 such that the areas that must be transparent are the hottest, so that in operation, excess alkali metal does not deposit in these areas.

Figure 8:
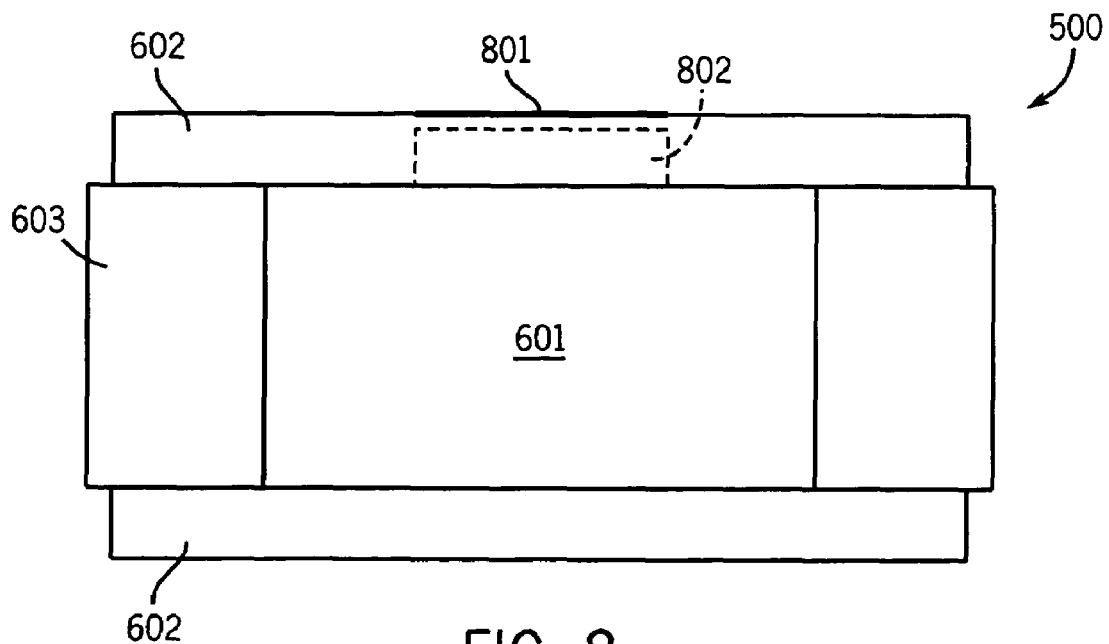
FIG. 8 is a side elevational view of a cell illustrating creation of a cold spot.

FIG. 8 illustrates how a cold spot can be insured by thinning a portion of the cover 602 to decrease lateral heat flow, and placing or depositing a high emissivity coating 801 at the center of the thinned area 802. The heater would be placed on the opposite silicon surface. Note that the sealing area and cold spot could be combined.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A cell comprising:
an alkali metal; and
a coating of parylene on an interior surface of the cell;
wherein the alkali metal is an optically pumped gaseous phase of an alkali metal.

2. The cell of claim 1, wherein the coating of parylene is deposited on an interior surface of the cell in a vacuum at room temperature.

3. The cell of claim 1, wherein the parylene coating minimizes interaction of the excited state of the alkali metal, increases lifetime of the excited state, and minimizes interaction of nuclear spin states with the cell walls.

4. A cell comprising:
an alkali metal; and
a coating of parylene on an interior surface of the cell;
wherein the alkali metal is deposited within the cell by pipetting an aliquot of liquid metal from an alkali metal source into the cell, and wherein the cell, the pipette, and the alkali metal source are all maintained at a temperature at least as great as the melting temperature of the alkali metal.

5. A cell comprising:
an alkali metal; and
a coating of parylene on an interior surface of the cell;
wherein the cell further comprises:
an optically transmissive material having an opening formed therethrough; and
top and bottom covers attached to the optically transmissive material.

6. The cell of claim 5, wherein the optically transmissive material comprises pyrex.

7. The cell of claim 5, wherein the top and bottom covers are attached to the optically transmissive material by anodic bonding.

8. The cell of claim 5, wherein one of the top or bottom covers includes an opening therethrough that serves as a fill hole for the cell.

9. The cell of claim 8, wherein the fill hole is sealed by placing a film of parylene over the fill hole and creating a melt zone that substantially circumscribes the fill hole.

10. The cell of claim 9, wherein the melt zone is provided by a temperature controlled iron that melts the parylene film.

11. The cell of claim 9, wherein the melt zone is provided by a controlled power laser directed to scan a path that substantially circumscribes the fill hole and melts the parylene film.

12. An apparatus comprising:
a cell formed from an optically transmissive material having an opening therethrough;
top and bottom covers attached to the optically transmissive material, one of the top or bottom covers including an opening therethrough that serves as a fill hole for the cell;
an alkali metal deposited within the cell; and
a coating of parylene on an interior surface of the cell;
wherein the alkali metal comprises an optically pumped gaseous phase of an alkali metal, and the parylene coating minimizes interaction of the excited state of the alkali metal, increases lifetime or the excited state, and minimizes interaction of nuclear spin states with the cell walls.

13. The apparatus of claim 12, wherein the coating of parylene is deposited on an interior surface of the cell in a vacuum at room temperature.

14. The apparatus of claim 12, wherein the alkali metal is deposited within the cell by pipetting an aliquot of liquid metal from an alkali metal source into the cell, wherein the cell, the pipette, and the alkali metal source are all maintained at a temperature at least as great as the melting temperature of the alkali metal.

15. The apparatus of claim 13, wherein the optically transmissive material comprises pyrex.

16. The apparatus of claim 12, wherein the top and bottom covers are attached to the optically transmissive material by anodic bonding.

17. The apparatus of claim 12, wherein the fill hole is sealed by placing a film or parylene over the fill hole and creating a melt zone that substantially circumscribes the fill hole.

18. The apparatus of claim 17, wherein the melt zone is provided by a temperature controlled iron that melts the parylene film.

19. The apparatus of claim 17, wherein the melt zone is provided by a controlled power laser directed to scan a path that substantially circumscribes the fill hole and melts the parylene film.

20. A method comprising the steps of:
   forming a cell from an optically transmissive material having an opening therethrough;
   attaching top and bottom covers to the optically transmissive material, one of the top or bottom covers having an opening therethrough to provide a fill hole for the cell;
   depositing a coating of parylene on an interior surface of the cell; and
   placing an alkali metal within the cell.

21. The method in accordance with claim 20, wherein the alkali metal comprises an optically pumped gaseous phase of an alkali metal, and the step of depositing a parylene coating on an interior surface of the cell minimizes interaction of the excited state of the alkali metal, increases lifetime of the excited state, and minimizes interaction of nuclear spin states with the cell walls.

22. The method in accordance with claim 20, wherein the step of depositing a coating of parylene further comprises the step of depositing a coating of parylene on an interior surface of the cell in a vacuum at room temperature.

23. The method in accordance with claim 20, wherein the step of placing an alkali metal within the cell further comprises the step of depositing an alkali metal within the cell by pipetting an aliquot of liquid metal from an alkali metal source into the cell, wherein the cell, the pipette, and the alkali metal source are all maintained at a temperature at least as great as the melting temperature of the alkali metal.

24. The method in accordance with claim 20, wherein the step of forming a cell from an optically transmissive material further comprises the step of forming the cell from pyrex.

25. The method in accordance with claim 20, wherein the step of attaching top and bottom covers to the optically transmissive material further comprises the step of attaching top and bottom covers to the optically transmissive material by anodic bonding.

26. The method in accordance with claim 20, further comprising the step of sealing the fill hole by placing a film of parylene over the fill hole and creating a melt zone that substantially circumscribes the fill hole.

27. The method in accordance with claim 26, wherein the melt zone is provided by a temperature controlled iron that melts the parylene film.

28. The method in accordance with, claim 26, wherein the melt zone is provided by a controlled power laser directed to scan a path that substantially circumscribes the fill hole and melts the parylene film.

29. An NMR gyro comprising:
   a cell formed from an optically transmissive material having an opening therethrough;
   top and bottom covers attached to the optically transmissive material, one of the top or bottom covers including an opening therethrough that serves as a fill hole for the cell;
   an alkali metal deposited within the cell; and
   a coating of parylene on an interior surface of the cell;
   wherein the alkali metal comprises an optically pumped gaseous phase of an alkali metal, and the parylene coating minimizes interaction of the excited state of the alkali metal, increases lifetime of the excited state, and minimizes interaction of nuclear spin states with the cell walls.

30. The NMR gyro of claim 29, further comprising at least one light source disposed proximate the cell, such that light from the light source is directed through the cell.

31. The NMR gyro of claim 30, further comprising at least one detector oppositely disposed from the light source.

32. The NMR gyro of claim 30, wherein the light source comprises a VCSEL light source.

33. The NMR gyro of claim 30, further comprising at least a partially mirrored surface on a portion of the cell.

34. The NMR gyro of claim 29, further comprising two light sources and two detectors, wherein the light sources and the detectors are orthogonally disposed with respect to one another.

35. The NMR gyro of claim 29, further comprising a heater disposed on the cell.

36. The NMR gyro of claim 35, wherein the heater disposed within the cell comprises a heater disposed within the cell by photolithography and deposition.

37. The NMR gyro of claim 35, wherein the heater disposed within the cell provides a temperature gradient within the cell interior such that surfaces requiring high transmissivity are maintained at the highest temperatures.

38. The NMR gyro of claim 35, further comprising:
   a thinned area provided over a portion of the cover to decrease lateral heat flow;
   a high emissivity coating proximate the center of the thinned area; and
   the heater disposed on a surface opposing the thinned area;
   such that a region of relatively low temperature is provided within the cell.

39. The NMR gyro of claim 29, further comprising a relatively uniform magnetic field directed through the cell interior.

40. An apparatus having combined NMR gyro and atomic clock functionality, the apparatus comprising:
   a cell formed from an optically transmissive material having an opening therethrough:
   top and bottom covers attached to the optically transmissive material, one of the top or bottom covers including an opening therethrough that serves as a fill hole for the cell;

an alkali metal deposited within the cell; and
a coating of parylene on an interior surface of the cell;
wherein the alkali metal comprises an optically pumped gaseous phase of an alkali metal, and the parylene coating minimizes interaction of the excited state of the alkali metal, increases lifetime of the excited state, and minimizes interaction of nuclear spin states with the cell walls.

* * * * *